United States Patent
Witte et al.

(10) Patent No.: US 9,337,552 B2
(45) Date of Patent: May 10, 2016

(54) DEVICE AND A METHOD FOR THE REVERSIBLE MECHANICAL FIXING AND ELECTRICAL CONTACTING OF ELECTRIC CONDUCTORS

(71) Applicant: Harting Electronics GmbH, Espelkamp (DE)

(72) Inventors: Markus Witte, Lohne (DE); Lars Fennen, Westoverledingen (DE)

(73) Assignee: HARTING ELECTRONICS GMBH, Espelkamp (DE)

( * ) Notice: Subject to any disclaimer, the term of this patent is extended or adjusted under 35 U.S.C. 154(b) by 0 days.

(21) Appl. No.: 14/392,020

(22) PCT Filed: Aug. 14, 2013

(86) PCT No.: PCT/DE2013/100293
§ 371 (c)(1),
(2) Date: Feb. 18, 2015

(87) PCT Pub. No.: WO2014/026678
PCT Pub. Date: Feb. 20, 2014

(65) Prior Publication Data
US 2015/0207241 A1      Jul. 23, 2015

(30) Foreign Application Priority Data

Aug. 17, 2012    (DE) .................. 10 2012 107 556

(51) Int. Cl.
*H01R 12/72*    (2011.01)
*H01R 12/79*    (2011.01)
(Continued)

(52) U.S. Cl.
CPC .............. *H01R 4/28* (2013.01); *G01R 1/0416* (2013.01); *G01R 31/021* (2013.01); *H01R 12/75* (2013.01); *H01R 12/721* (2013.01)

(58) Field of Classification Search
CPC ........ H01R 4/28; H01R 12/75; H01R 12/721; H01R 12/722; H01R 2201/20; G01R 31/045; G01R 31/04; G01R 31/021; G01R 31/024; G01R 31/272
USPC .......... 439/493, 711, 482; 324/538–539, 541, 324/543–544
See application file for complete search history.

(56) References Cited

U.S. PATENT DOCUMENTS 6,123,550 A    9/2000   Burkert et al.
6,602,092 B2 *  8/2003   Soubh .................... H01R 12/62
                                                         439/493

(Continued)

FOREIGN PATENT DOCUMENTS

DE        10157640       6/2003
EP         0848459       6/1998
WO       WO 01/22097     6/2003

*Primary Examiner* — Abdullah Riyami
*Assistant Examiner* — Harshad Patel
(74) *Attorney, Agent, or Firm* — Jacobson Holman, PLLC.

(57) ABSTRACT

A device for the reversible mechanical fixing and electrical contacting of one or more electrical conductors (11) of a cable (10) it is proposed to fix the cable (10) mechanically by means of a cable receptacle (2) and to position exposed conductor ends (12) of the electrical conductor (11) on a contact plate (3). A fixing element (4) is provided for pressing the exposed conductor ends (12) onto the contact plate (3). Such a device and such a method are needed for the temporary electronic contacting of one or more electrical conductors carried in a cable. Such contacting is above all necessary for carrying out electrical measurements on such cables.

13 Claims, 5 Drawing Sheets

Figure 1:
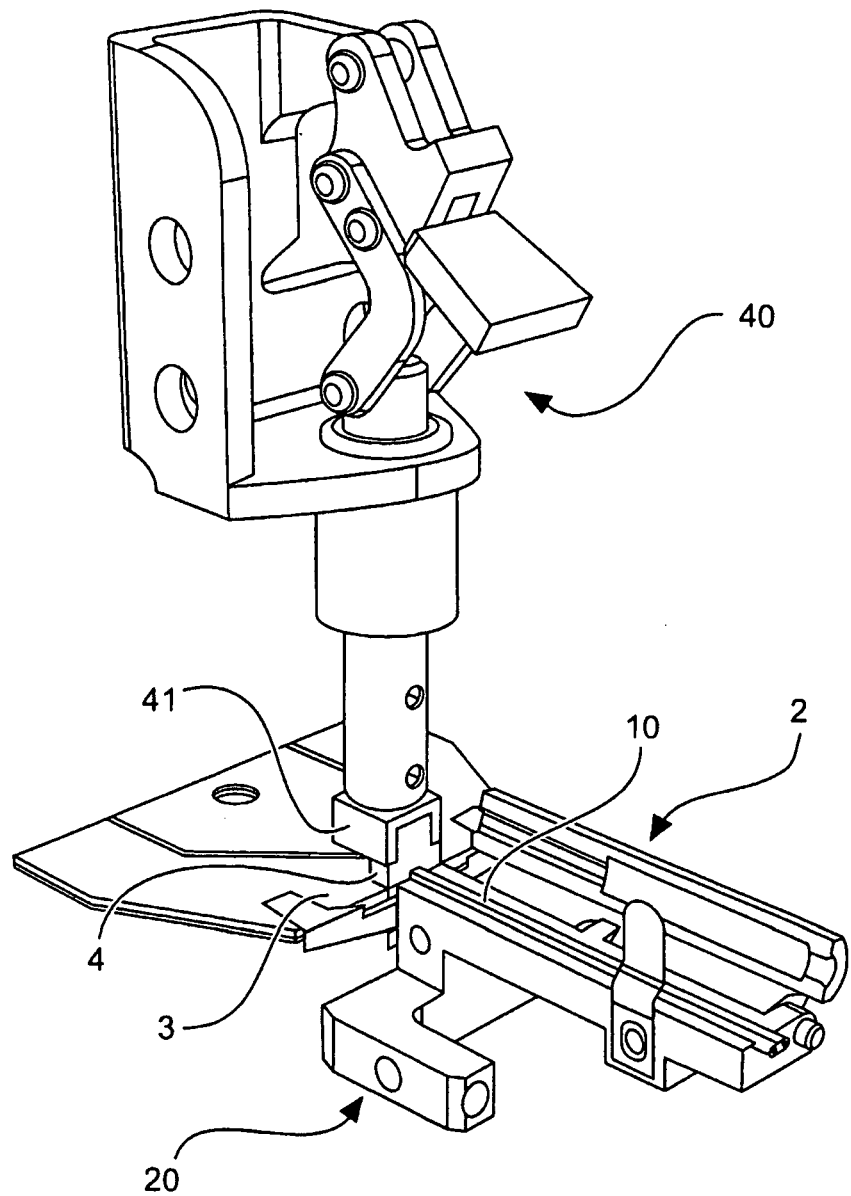

(51) Int. Cl.
*H01R 4/28* (2006.01)
*G01R 1/04* (2006.01)
*G01R 31/02* (2006.01)
*H01R 12/75* (2011.01)

(56) References Cited

U.S. PATENT DOCUMENTS

| | | | |
|---|---|---|---|
| 6,786,762 B2* | 9/2004 | Buck | H01R 12/62 439/493 |
| 7,510,425 B2* | 3/2009 | Kuo | H05K 3/3405 439/493 |
| 2004/0185708 A1* | 9/2004 | Kuwahara | H01R 4/023 439/497 |
| 2005/0208828 A1 | 9/2005 | Miller et al. | |
| 2011/0306235 A1 | 12/2011 | Tanaka et al. | |
| 2012/0100748 A1* | 4/2012 | Sun | H01R 13/7172 439/490 |
| 2013/0040482 A1* | 2/2013 | Ngo | H01R 12/7023 439/328 |
| 2013/0161071 A1* | 6/2013 | Kodama | H05K 1/18 174/250 |

* cited by examiner

DEVICE AND A METHOD FOR THE REVERSIBLE MECHANICAL FIXING AND ELECTRICAL CONTACTING OF ELECTRIC CONDUCTORS

The invention relates to a device for the reversible mechanical fixing and electrical contacting of one or more electrical conductors of a cable.

Further, the invention relates to a method for the reversible mechanical fixing and electrical contacting of one or more electrical conductors of a cable.

Such a device and such a method are needed for the temporary electrical contacting of one or more electrical conductors carried in a cable. Such contacting is above all necessary for carrying out electrical measurements on such cables. Especially in the area of high frequency measurements, it must be possible to carry out repeated measurements on cables with consistent quality. To this end, an electrical contacting of the cables with consistent quality is required.

PRIOR ART

So far it has been standard practise to solder the individual electrical conductors of cables to measurement devices or to solder plug-in connectors on, which are contacted with a measurement unit.

On the one hand, this soldering process is very time-consuming. Above all in the case of cables having very small conductor cross sections, the soldering on of plug-in connectors by hand is very complex.

On the other hand, it is not possible to ensure a consistent quality of the solder joints. Depending on who carries out the soldering and under which conditions, the quality of the solder joints may vary considerably. Such fluctuations of the solder joints have a great influence on the measurement results especially in the high frequency range.

As an alternative to soldering electrical conductors, a connection structure with a positioning block and a dielectric substrate is known from US 2005/208825 A1. A coaxial cable has an end section that is accommodated in a passage in the positioning block. By means of the positioning block, the end face of the coaxial cable can be positioned perpendicularly to the dielectric substrate.

What is of disadvantage in this solution is that the coaxial cables are contacted with their end side on the substrate surface. This is possible with coaxial cables, even with several next to each other, however it is not suitable for cables having finer wires. Moreover, the insertion of the coaxial cable into such a positioning block is very complex and time-consuming.

OBJECT

The invention is therefore based on the object of providing a device and a method, by means of which electrical conductors of cables can be mechanically fixed in a simple and reversible manner, aligned to the device for contacting and electrically contacted. In this respect, repeatability with consistent quality of the contact is to be ensured. Moreover, the contacting is to be carried out in a time-saving manner.

This object is achieved by means of the subject matter of independent claim 1.

Advantageous embodiments of the invention are indicated in the dependent claims.

The invention relates to a device that is substantially composed of three parts: a cable receptacle, a contact plate and a fixing element.

The cable receptacle is used for fixing a cable to be contacted. In doing so, the end of the cable to be contacted is linearly aligned over an area and is mechanically grasped by the cable receptacle and fixed in this way. Stripped, exposed conductor ends of the cable are here not grasped by the cable receptacle. These protrude as the final end beyond the cable receptacle for electrical and mechanical contacting.

The cable receptacle follows on from the end of the stripped, exposed conductor ends of the contact plate. These are arranged approximately parallel to the linearly aligned cable. On the contact plate, electrical conductor paths are provided, preferably in the same number as the number of electrical contacts of the cable.

One end of each of the electric conductor paths forms a contact area on the contact plate. Expediently, this is located on the edge area of the contact plate. In this contact area, the cable receptacle with the exposed conductor ends advantageously follows on from the contact plate.

The cable receptacle is so close to the contact plate that the stripped, exposed conductor ends rest on the contact plate. These can be adjusted in such a way that in each case one exposed conductor end lies on the contact area of the electrical conductor paths.

In an advantageous development, a mechanism is provided on the cable receptacle. By means of this mechanism, the cable receptacle can be moved towards the contact plate and away therefrom, preferably in a linear motion. The movement of the cable receptacle is used for contacting one of the exposed conductor ends—preferably a filler wire carried in the cable.

In doing so, the exposed conductor end is clamped between the cable receptacle and the end side of the contact plate. For this embodiment, the contact plate has a further contact area that is located on the end side of the contact plate towards the cable receptacle.

In a preferred embodiment, an elastic, electrically conductive spring element is provided on the further contact area between the contact plate and the cable receptacle. The exposed conductor is pressed against the spring element by means of the cable receptacle, as a result of which it is always the same force that acts on the exposed conductor. The electrically conductive spring element in turn electrically contacts the further contact area of the contact plate.

For a mechanical fixing and an electrically secure contacting of the exposed conductor ends on the conductor paths in the contact area of the contact plate, the fixing element is provided. This is positioned above the contact plate in the contact area and can be moved on the contact plate by means of a mechanism.

The electrically insulating fixing element is preferably made from an elastic material. By means of a mechanism—preferably a knee lever—the fixing element can be pushed onto the contact area. By means of the elastic, electrically insulating material, the exposed conductor ends positioned on the conductor paths are pressed onto the contact plate.

As a result of the always consistent fixing of the cable, the positioning of the exposed conductor ends and the pressing on of the latter by means of the fixing element on the conductor paths, a repeatable electrical contacting of the electrical conductors with consistent quality is achieved. By connecting a measurement unit to the conductor paths, a consistent and repeatable measurement of cables thus becomes possible.

In a further advantageous embodiment, a number of the devices according to the invention are arranged together. As a result, also cables that have a plurality of electrical conductor pairs can be contacted. These can therefore be inserted pairwise into the device and can be contacted.

It is particularly advantageous here to arrange the devices in a circular manner. As a result, the lengths of the individual, exposed conductor pairs of the cable are identical, which is for example advantageous for the measurement of the cables.

Further embodiments of the invention are described in the dependent claims.

EMBODIMENT EXAMPLE

Figure 2:
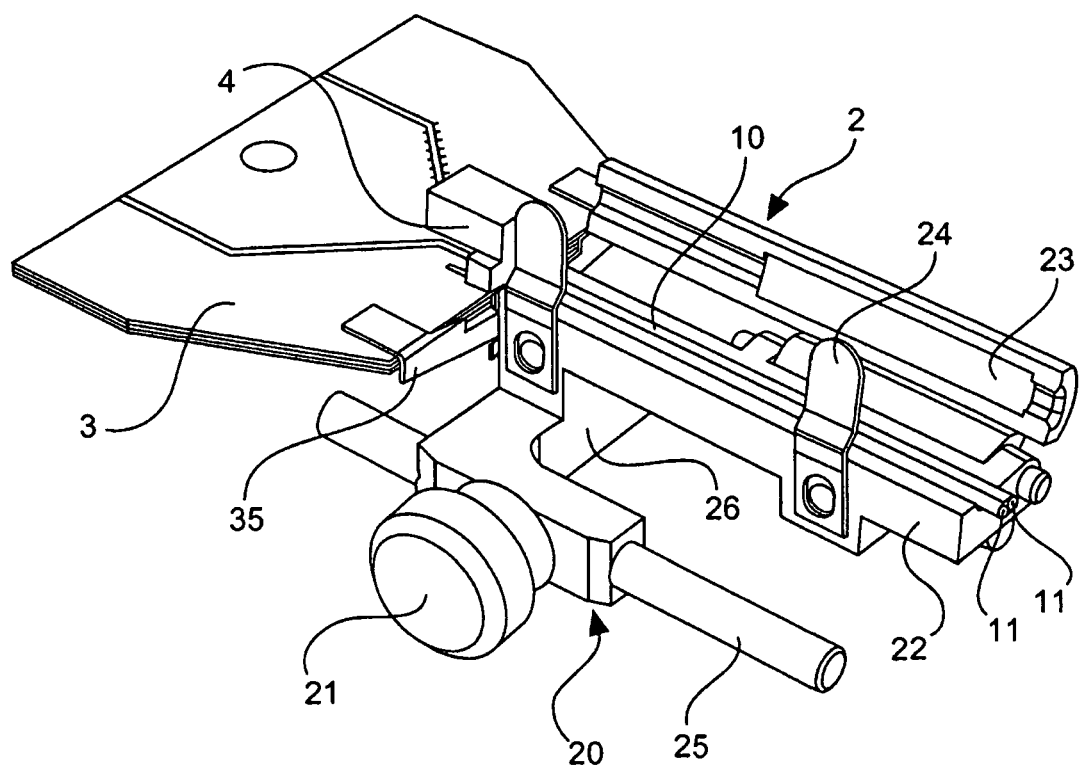
Figure 3:
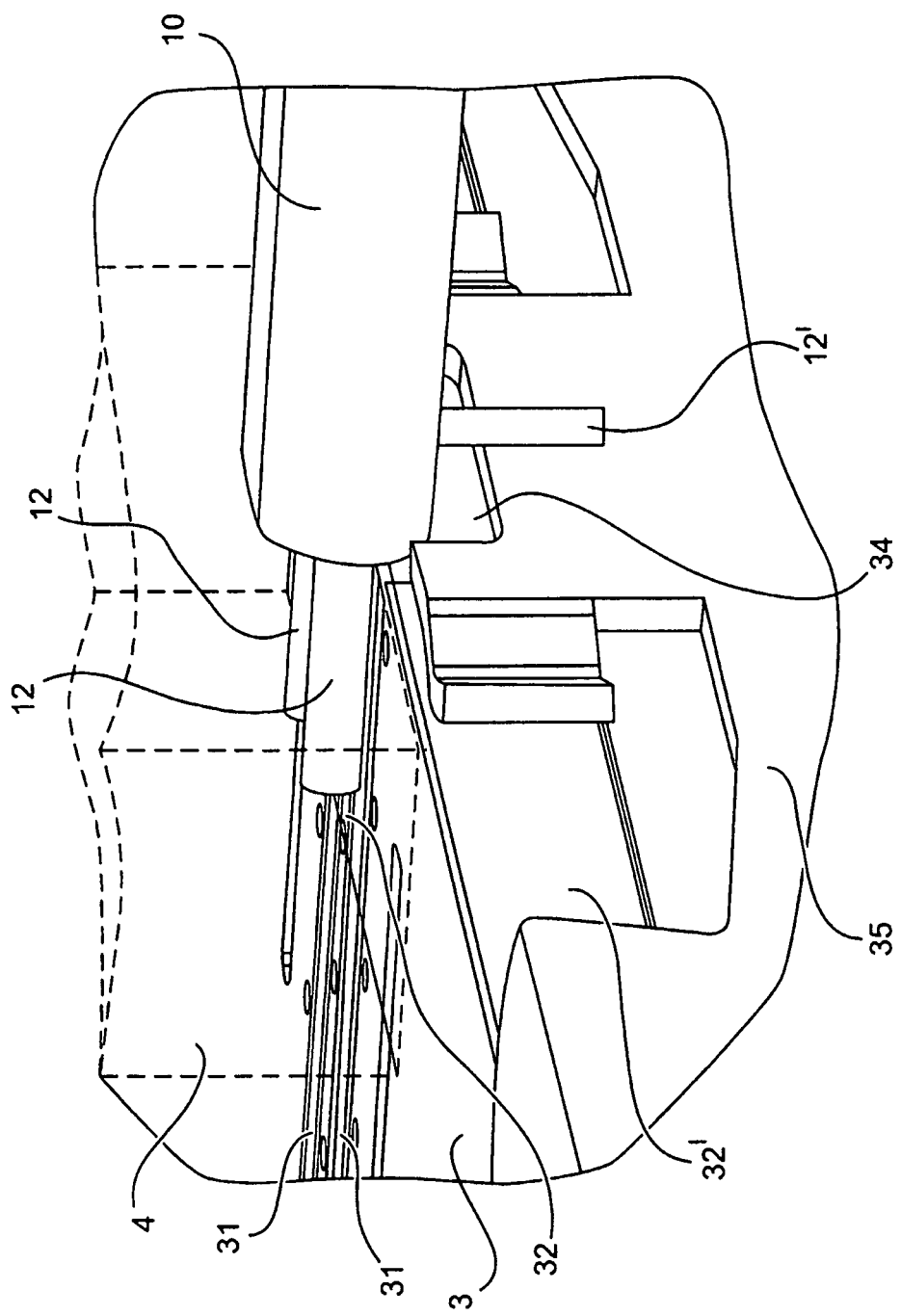
Figure 4:
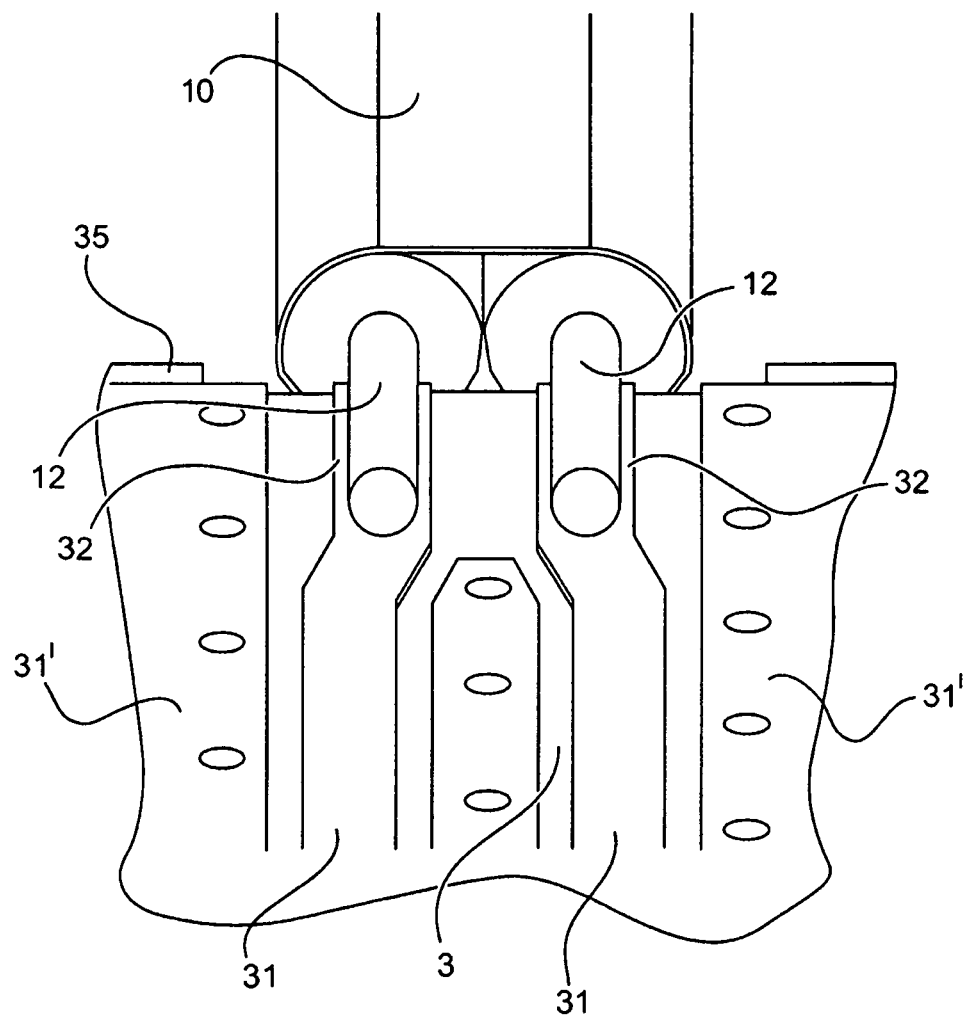
Figure 5:
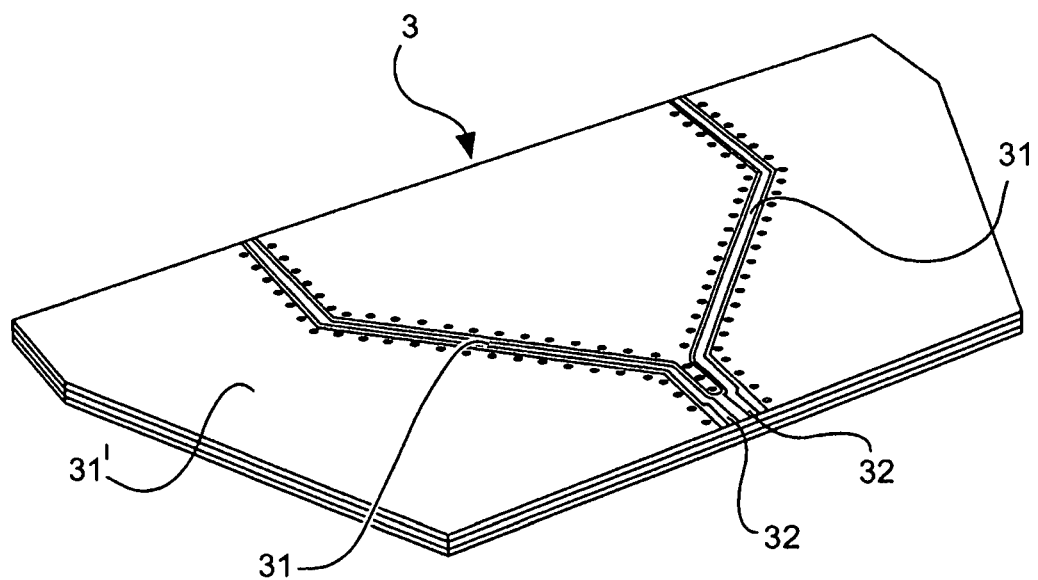

An embodiment example of the invention is shown in the drawings and will be explained in more detail below, wherein:

FIG. 1 shows a three-dimensional view of a device according to the present invention, FIG. 2 shows a more detailed three-dimensional view of a device from FIG. 1, FIG. 3 shows a detailed view of fixed and contacted exposed conductor ends, FIG. 4 shows a contact area with contacted conductors, and FIG. 5 shows a three-dimensional view of a contact plate.

FIG. 1 shows a three-dimensional view of a device according to the present invention. The device substantially comprises a cable receptacle 2, a contact plate 3 and a fixing element 4.

In the open cable receptacle 2, a cable 10 that is to be mechanically fixed and electrically contacted by means of the device can be seen. Further, a mechanism 20 is shown that is used for setting the cable receptacle 2 into a linear motion away from the contact plate 3 and towards the latter.

Above the fixing element 4, a further mechanism 40 is shown that is used for moving the fixing element 4 away from the contact plate 3 and towards the latter.

In this embodiment, the mechanism 40 is formed as a knee lever. However, other embodiments, for example in the form of a threaded rod or a gear rack, are also conceivable.

FIG. 2 shows a more detailed view of the device shown in FIG. 1. The cable receptacle 2 is formed by a cable support 22. The cable support 22 is connected to a cable cover 23 via a hinge. When the cable cover 23 is folded onto the cable support 22, the two together fix the inserted cable 10.

A cover clamp 24 prevents the cable cover 23 and the cable support 22 from being opened. In this embodiment example, the cover clamp 24 is merely a spring sheet, into which the cable cover 23 latches. More complex closure arrangements are also conceivable.

The cable receptacle 2 is attached to a cable slide 26. This forms, together with here two slide guides 25 and a tensioning screw 21, the mechanism 20 for moving the cable receptacle 2. In this respect, the cable slide 26 can be moved along the two slide guides 25 linearly towards the contact plate 3 and away therefrom. By means of the tensioning screw 21, the cable slide 26 can be fixed in any position.

The contact plate 3 can be seen mounted in a housing (not shown here). The fixing element 4, which is held by a receptacle 41, presses onto the contact plate 3. The receptacle 41 in turn is fixed to the mechanism 40 (not shown either), which allows a movement of the fixing element 4.

A spring element 35 can be seen between the cable receptacle 2 and the contact plate 3. This is used for additionally contacting an electrical conductor 11' extending in the cable 10, which is here formed as a filler wire. The function of the spring element 35 will be described in more detail in FIG. 3.

FIG. 3 shows, in a more detailed view, the mechanical fixing and electrical contacting of exposed conductor ends 12, 12'. For a clearer illustration, the cable receptacle 2 is not shown in this view. This would surround the cable 10.

The exposed conductor ends 12 lie on the electrical conductor paths 31 in the contact area 32 on the contact plate 3. By means of the fixing element 4, the exposed conductor ends 12 are pressed onto the electrical conductor paths 31. In this way, a secure electrical contacting of the exposed conductor ends 12 onto the conductor paths 31 can be ensured.

In the bottom area, the spring element 35 can be seen. This is positioned on the end side 34 of the contact plate 3 in such a way that it faces the cable receptacle 2 (not shown here) and electrically contacts a further contact area 32' of the contact plate 3.

The further contact area 32' of the contact plate 3 is located on the end side 34 thereof and is formed by a further electrical conductor path 31'. This is used above all for contacting a further electric conductor 11' carried in the cable 10, which extends to the electric conductors 11 as a filler wire.

For contacting the further electric conductors 11', the exposed conductor end 12' is not guided on the contact plate 2 into the contact area 32, but is bent vertically downwards in order to contact the spring element 35. In order to ensure a secure contacting, the further exposed conductor end 12' is clamped between the spring element 35 and the cable receptacle 2 (not shown here). This is done by displacing the cable receptacle 2 in the direction of the end side 34 of the contact plate 3.

As a result of the fact that the further electrical conductor 11' is not directly pressed onto the further contact area 32' but against the spring element 35, a consistent force and thus contact of the conductor 11' can be ensured, no matter how far the cable receptacle 2 is moved up to the contact plate 3.

The contact area 32 of the contact plate 2 is shown in more detail in FIG. 4 with contacted, exposed conductor ends 12. The exposed conductor ends 12 of the cable 10 rest on the electrical conductor paths 31 forming the contact area 32.

In the outer areas of FIG. 4, further electrical conductor paths 31' are shown which form a further contact area 32' on the end side 34 of the contact plate 3. On this further contact area 32', the spring element 35 is provided, which electrically contacts the further contact area 32'.

The electrical conductor paths 31, 31' are shown again in FIG. 5 in a three-dimensional view of the contact plate 3. What can be seen are the electrical conductor paths 31, which are located close together in the contact area 32 and which in the rear area of the contact plate 3 are spaced further apart and allow contacting for the onward transfer of signals. Here, both a plug-in connector that is applied to the contact plate 3 and a permanent soldering on of a cable would be conceivable.

LIST OF REFERENCE NUMERALS

2. Cable receptacle
3. Contact plate
4. Fixing element
10. Cable
11. Electrical conductor
12. Exposed conductor end
20. Mechanism of the cable receptacle 2
21. Tensioning screw
22. Cable support
23. Cable cover
24. Cable clamp
25. Slide guide
26. Cable slide
31. Electrical conductor path
32. Contact area
34. End side
35. Spring element
40. Mechanism of the fixing element 4
41. Receptacle

The invention claimed is:

1. A device for the reversible mechanical fixing and electrical contacting of one or more electrical conductors (11) of a cable (10),
comprising a cable receptacle (2), a contact plate (3) and a fixing element (4),
wherein in the cable receptacle (2), the cable (10) with at least one electrical conductor (11) extending therein can be mechanically fixed in a reversible manner,
wherein the contact plate (3) has at least one electrical conductor path (31), on which an exposed conductor end (12) of the at least one electrical conductor (11) can be contacted, and
the contact plate (3) has a contact area (32) that is formed by one end of the at least one electrical conductor path (31),
wherein the fixing element (4) has a mechanism (40) that allows the fixing element (4) to be moved towards the contact plate (3) and away therefrom,
characterised in that
the cable receptacle (2) is located on an end side (34) of the contact plate (3), so that a cable (10), that can be fixed in the cable receptacle (2), can be moved away from the contact plate (3), and in that
the cable receptacle (2) has a mechanism (20) that allows the cable receptacle (2) to be moved towards the end side (34) of the contact plate (3) and away therefrom.

2. The device as claimed in claim 1, characterised in that the at least one electrical conductor path (31) is connected with the end that does not form the contact area (32) to an electrical plug-in connector.

3. The device as claimed in claim 1, characterised in that the contact plate (3) has at least one further electrical conductor path (31') that forms a further contact area (32').

4. The device as claimed in claim 1, characterised in that the cable receptacle (2) is aligned in such a way that a cable (10) that can be fixed in the cable receptacle (2) extends, at least in sections, approximately parallel to the surface of the contact plate (3) and the exposed conductor end (12) of the at least one electrical conductor (11) rests on the contact area (32) of the contact plate (3).

5. The device as claimed in claim 1, characterised in that the contact plate (3) has the further contact area (32') on the end side (34) that faces the cable receptacle (2).

6. The device as claimed in claim 1, characterised in that an electrically conductive spring element (35) is provided on the further contact area (32') of the contact plate (3), wherein the spring element (35) is provided between the contact area (32') and the cable receptacle (2).

7. The device as claimed in claim 1, characterised in that the fixing element (4) consists of an elastically deformable, electrically non-conductive material.

8. The device as claimed in claim 1, characterised in that the fixing element (4) can be pressed onto the at least one electrical conductor path (31) of the contact plate (3) by means of the mechanism (40).

9. The device as claimed in claim 1, characterised in that the mechanism (40) for moving the fixing element (4) is a knee lever.

10. The device as claimed in claim 1, characterised in that the mechanism (20) is suitable for moving the cable receptacle (2) linearly towards the contact plate (3) and away therefrom.

11. The device as claimed in claim 10, characterised in that the mechanism (20) is formed by a cable slide (26) that is positioned in a linearly displaceable manner on at least one slide guide (25) and can be fixed in its position on the at least one slide guide (21) by means of a tensioning screw (21).

12. The device as claimed in claim 1, characterised in that a number of the devices are positioned next to each other for contacting cables (10) having a plurality of electrical conductors (11).

13. The device as claimed in claim 12, characterised in that the number of devices are arranged in a circular manner.

* * * * *